US010312259B2

(12) United States Patent
Doris et al.

(10) Patent No.: US 10,312,259 B2
(45) Date of Patent: Jun. 4, 2019

(54) CHANNEL SIGE DEVICES WITH MULTIPLE THRESHOLD VOLTAGES ON HYBRID ORIENTED SUBSTRATES, AND METHODS OF MANUFACTURING SAME

(71) Applicant: International Business Machines Corporation, Armonk, NY (US)

(72) Inventors: Bruce B. Doris, Slingerlands, NY (US); Lisa F. Edge, Watervliet, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 15/220,608

(22) Filed: Jul. 27, 2016

(65) Prior Publication Data

US 2016/0336345 A1    Nov. 17, 2016

Related U.S. Application Data

(63) Continuation of application No. 14/264,259, filed on Apr. 29, 2014, now Pat. No. 9,490,161.

(51) Int. Cl.
*H01L 27/12*    (2006.01)
*H01L 21/762*    (2006.01)
(Continued)

(52) U.S. Cl.
CPC .... *H01L 27/1203* (2013.01); *H01L 21/02532* (2013.01); *H01L 21/02609* (2013.01);
(Continued)

(58) Field of Classification Search
CPC ......... H01L 21/02532; H01L 21/02609; H01L 21/7624; H01L 27/1203; H01L 29/04; H01L 29/045; H01L 21/823412
(Continued)

(56) References Cited

U.S. PATENT DOCUMENTS 4,763,183 A * 8/1988 Ng .................... H01L 21/743
257/288
4,933,298 A * 6/1990 Hasegawa ........... H01L 21/2026
438/150
(Continued)

OTHER PUBLICATIONS

Hikavyy et al., "Growth of High Ge Content SiGe on (110) Oriented Si Wafers," Thin Solid Films, vol. 520, Issue 8, Feb. 1, 2012, pp. 3179-3184.
(Continued)

*Primary Examiner* — Jay C Kim
(74) *Attorney, Agent, or Firm* — L. Jeffrey Kelly; Ryan, Mason & Lewis, LLP

(57) ABSTRACT

Multiple threshold voltage devices on hybrid oriented substrates, and methods of manufacturing same are disclosed. A method for manufacturing a semiconductor device comprises performing a single epitaxy step on a hybrid orientation substrate including a first region having a first crystallographic orientation and a second region having a second crystallographic orientation different from the first crystallographic orientation, wherein the single epitaxy step forms a first layer disposed on the first region and a second layer disposed on the second region, the first layer has the first crystallographic orientation and a first composition, and the second layer has the second crystal orientation and a second composition different from the first composition.

12 Claims, 12 Drawing Sheets

(51) Int. Cl.
*H01L 27/088* (2006.01)
*H01L 21/8234* (2006.01)
*H01L 21/02* (2006.01)
*H01L 21/84* (2006.01)
*H01L 29/04* (2006.01)
*H01L 29/06* (2006.01)
*H01L 29/10* (2006.01)
*H01L 29/161* (2006.01)
*H01L 29/78* (2006.01)

(52) U.S. Cl.
CPC .. *H01L 21/7624* (2013.01); *H01L 21/823412* (2013.01); *H01L 21/823481* (2013.01); *H01L 21/84* (2013.01); *H01L 27/088* (2013.01); *H01L 29/045* (2013.01); *H01L 29/0649* (2013.01); *H01L 29/1033* (2013.01); *H01L 29/161* (2013.01); *H01L 29/7838* (2013.01)

(58) Field of Classification Search
USPC .......................................................... 257/347
See application file for complete search history.

(56) References Cited

U.S. PATENT DOCUMENTS

| | | | |
|---|---|---|---|
| 6,362,071 B1 | 3/2002 | Nguyen et al. | |
| 6,746,926 B1* | 6/2004 | Yu .................. | H01L 21/823807 257/E21.43 |
| 6,939,751 B2* | 9/2005 | Zhu ................. | H01L 21/84 257/E21.415 |
| 6,972,478 B1* | 12/2005 | Waite .............. | H01L 21/823807 257/347 |
| 6,995,456 B2* | 2/2006 | Nowak ............. | H01L 27/1203 257/347 |
| 6,998,684 B2* | 2/2006 | Anderson ......... | H01L 21/76251 257/351 |
| 7,023,055 B2* | 4/2006 | Ieong .............. | H01L 21/76254 257/369 |
| 7,060,585 B1* | 6/2006 | Cohen ............. | H01L 21/823807 257/E21.633 |
| 7,067,379 B2* | 6/2006 | Wen ................ | H01L 21/84 257/E21.415 |
| 7,087,965 B2* | 8/2006 | Chan ............... | H01L 21/2022 257/347 |
| 7,094,634 B2* | 8/2006 | Zhu ................. | H01L 21/76254 257/E21.131 |
| 7,115,955 B2* | 10/2006 | Messenger ........ | H01L 29/66742 257/369 |
| 7,217,629 B2* | 5/2007 | Furukawa ......... | H01L 21/76254 257/347 |
| 7,220,626 B2* | 5/2007 | Zhu ................. | H01L 21/84 257/E21.633 |
| 7,253,034 B2* | 8/2007 | Chan ............... | H01L 21/76243 257/E21.563 |
| 7,268,377 B2* | 9/2007 | Ieong .............. | H01L 21/823807 257/255 |
| 7,288,458 B2* | 10/2007 | Adetutu ........... | H01L 21/76254 257/E21.127 |
| 7,291,539 B2* | 11/2007 | Fogel .............. | H01L 21/2022 257/E21.133 |
| 7,298,009 B2* | 11/2007 | Yan ................. | H01L 21/76232 257/255 |
| 7,309,660 B2* | 12/2007 | Chen ............... | H01L 21/02381 257/E21.132 |
| 7,342,287 B2 | 3/2008 | Chuang et al. | |
| 7,435,639 B2* | 10/2008 | Winstead .......... | H01L 21/84 257/E21.632 |
| 7,439,110 B2 | 10/2008 | Cheng et al. | |
| 7,439,542 B2* | 10/2008 | Yang ............... | H01L 21/84 257/347 |
| 7,538,390 B2 | 5/2009 | Wang et al. | |
| 7,575,968 B2 | 8/2009 | Sadaka et al. | |
| 7,608,491 B2* | 10/2009 | Clavelier ......... | C30B 19/12 257/E21.561 |
| 7,629,233 B2 | 12/2009 | Bernstein et al. | |
| 7,704,809 B2 | 4/2010 | Yeo et al. | |
| 7,723,791 B2* | 5/2010 | Zhu ................. | H01L 21/76254 257/353 |
| 7,737,532 B2* | 6/2010 | Ke .................. | H01L 21/823807 257/627 |
| 7,754,587 B2* | 7/2010 | Spencer ........... | H01L 21/0237 257/E21.131 |
| 7,781,278 B2 | 8/2010 | Zhu | |
| 7,790,528 B2* | 9/2010 | Spencer ........... | H01L 21/76283 257/E21.637 |
| 7,888,197 B2 | 2/2011 | Chidambarrao et al. | |
| 8,039,401 B2 | 10/2011 | Wang et al. | |
| 8,097,516 B2 | 1/2012 | Chan et al. | |
| 8,097,924 B2* | 1/2012 | Wang ............... | H01L 21/28194 257/344 |
| 8,125,032 B2 | 2/2012 | Adetutu et al. | |
| 8,241,970 B2* | 8/2012 | Cohen .............. | H01L 21/845 257/E29.004 |
| 8,309,447 B2 | 11/2012 | Cheng et al. | |
| 8,318,555 B2* | 11/2012 | Signamarcheix ........................... | H01L 21/76254 257/64 |
| 8,394,704 B2 | 3/2013 | Bidal et al. | |
| 8,466,473 B2 | 6/2013 | Cai et al. | |
| 8,501,577 B2 | 8/2013 | Bian et al. | |
| 8,530,355 B2* | 9/2013 | Yan ................. | H01L 21/84 438/697 |
| 8,587,063 B2 | 11/2013 | Dennard et al. | |
| 8,659,054 B2* | 2/2014 | Rim ................ | H01L 21/26506 257/192 |
| 9,129,863 B2* | 9/2015 | Caimi .............. | H01L 21/02532 |
| 9,559,160 B2* | 1/2017 | Cappellani ........ | H01L 29/66439 |
| 2005/0116290 A1 | 6/2005 | de Souza et al. | |
| 2007/0126036 A1* | 6/2007 | Ohta ............... | H01L 29/165 257/288 |
| 2008/0128813 A1 | 6/2008 | Mizushima et al. | |
| 2013/0221412 A1* | 8/2013 | Bian ................ | H01L 27/1207 257/255 |

OTHER PUBLICATIONS

List of IBM Patents or Patent Applications Treated as Related.

* cited by examiner

CHANNEL SIGE DEVICES WITH MULTIPLE THRESHOLD VOLTAGES ON HYBRID ORIENTED SUBSTRATES, AND METHODS OF MANUFACTURING SAME

TECHNICAL FIELD

The field generally relates to multiple threshold voltage devices and methods of manufacturing same and, in particular, to multiple threshold voltage devices on hybrid oriented substrates, and methods of manufacturing same.

BACKGROUND

Multiple threshold voltage (Vt) devices have become a key technology requirement for system-on-chip (SoC) applications. In known methods, channel doping is not used, and work function tuning is required to result in different threshold voltages for fully depleted devices such as, extremely thin silicon-on-insulator (ETSOI) or fin field-effect transistor (FinFET) devices. Conventional integration schemes to enable multiple Vt devices result in enormous process complexity.

Accordingly, there is a need for simplified processing of multiple Vt devices, and multiple Vt devices which can be manufactured using the simplified processing.

SUMMARY

In general, exemplary embodiments of the invention include multiple threshold voltage devices and methods of manufacturing same and, in particular, to multiple threshold voltage devices on hybrid oriented substrates, and methods of manufacturing same.

According to an exemplary embodiment of the present invention, a method for manufacturing a semiconductor device comprising performing a single epitaxy step on a hybrid orientation substrate including a first region having a first crystallographic orientation and a second region having a second crystallographic orientation different from the first crystallographic orientation, wherein the single epitaxy step forms a first layer disposed on the first region and a second layer disposed on the second region, the first layer has the first crystallographic orientation and a first composition, and the second layer has the second crystal orientation and a second composition different from the first composition.

According to an exemplary embodiment of the present invention, a semiconductor device, comprises a hybrid orientation substrate including a first region having a first crystallographic orientation and a second region having a second crystallographic orientation different from the first crystallographic orientation, a first layer disposed on the first region and having the first crystallographic orientation and a first composition, and a second layer disposed on the second region and having the second crystal orientation and a second composition different from the first composition.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Exemplary embodiments of the invention will now be discussed in further detail with regard to multiple threshold voltage devices and methods of manufacturing same and, in particular, to multiple threshold voltage devices on hybrid oriented substrates, and methods of manufacturing same. This invention may, however, be embodied in many different forms and should not be construed as limited to the embodiments set forth herein.

The embodiments of the present invention include multiple Vt devices and methods of manufacturing same which eliminate one or more mask steps for multiple Vt devices by integrating, for example a multiple Vt device with fewer epitaxy steps. In accordance with embodiments of the present invention, depending on how many threshold voltages are desired, a method for manufacturing a multiple Vt device utilizes, for example, one or two epitaxy steps, and may not require masking or doping.

It is to be understood that the various layers and/or regions shown in the accompanying drawings are not drawn to scale, and that one or more layers and/or regions of a type commonly used in multiple Vt devices may not be explicitly shown in a given drawing. This does not imply that the layers and/or regions not explicitly shown are omitted from the actual multiple Vt devices. Moreover, the same or similar reference numbers used throughout the drawings are used to denote the same or similar features, elements, or structures, and thus, a detailed explanation of the same or similar features, elements, or structures will not be repeated for each of the drawings.

The multiple Vt devices and methods for forming same in accordance with the embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the multiple Vt devices are contemplated embodiments of the invention. Given the teachings of the embodiments of the invention provided herein, one of ordinary skill in the art will be able to contemplate other implementations and applications of embodiments of the invention.

Figure 1:
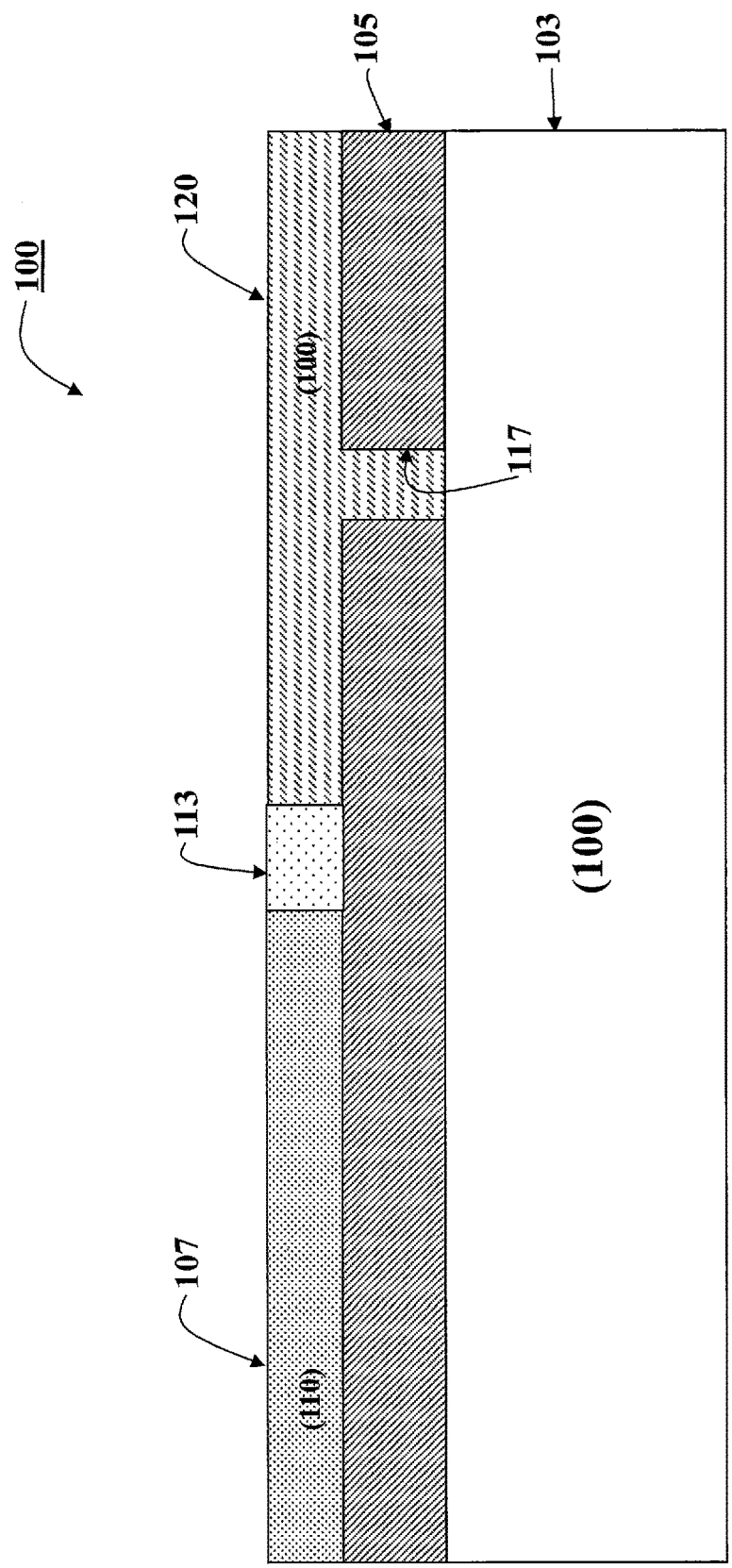
FIG. 1 is a cross-sectional view illustrating a hybrid orientation technology (HOT) substrate including a planarized silicon-on-insulator, silicon region and an isolation region, in a method of manufacturing a multiple Vt device, according to an exemplary embodiment of the present invention.

Referring to FIG. 1, which is a cross-sectional view illustrating a hybrid orientation technology (HOT) substrate in a method of manufacturing a multiple Vt device, according to an exemplary embodiment of the present invention, a silicon-on-insulator (SOI) substrate 100 can be used as a HOT substrate 100 of the multiple Vt device structure. The HOT substrate 100 includes a semiconductor substrate 103, a buried insulating layer 105, such as, for example, a buried oxide (BOX) or nitride layer, located on an upper surface of the semiconductor substrate 103, and a first semiconductor layer 107 (e.g., silicon-on-insulator (SOI)) and a second semiconductor layer 120 (e.g., silicon region) located on an upper surface of the buried insulating layer 105. The substrate 103 and layers 107 and 120 may comprise one or more semiconductor materials including, but not limited to, Si, SiGe, SiC, SiGeC or other like semiconductor. In accordance with an embodiment of the present invention, the substrate 103 and layer 120 have a first crystallographic surface orientation (100) and the layer 107 has a second crystallographic surface orientation (110). Alternatively, the first and second crystallographic surface orientations can be reversed so that the crystallographic surface orientation of the substrate 103 and layer 120 is (110) and the crystallographic surface orientation of the layer 107 is (100). In another alternative, the crystallographic surface orientation (100) or (110) may be substituted with a crystallographic surface orientation of (111). An isolation region 113, such as, for example, shallow trench isolation (STI) region, is formed between the layers 107 and 120.

Referring to FIG. 1, in accordance with an exemplary embodiment of the present invention, the layer 120 is a silicon region 120 formed on the substrate 103 in hole 117 and on the a portion of the buried insulating layer 105. According to an embodiment, the silicon region 120 is formed by epitaxially growing silicon on the substrate 103, resulting in silicon region 120 having the same crystallographic orientation as the substrate 103 (i.e., (100)). In accordance with an embodiment, a planarization process such as, for example, a chemical mechanical polishing (CMP) process, is performed to result in top surfaces of the layer 107, isolation region 113 and silicon region 120 being coplanar with each other.

Figure 2:
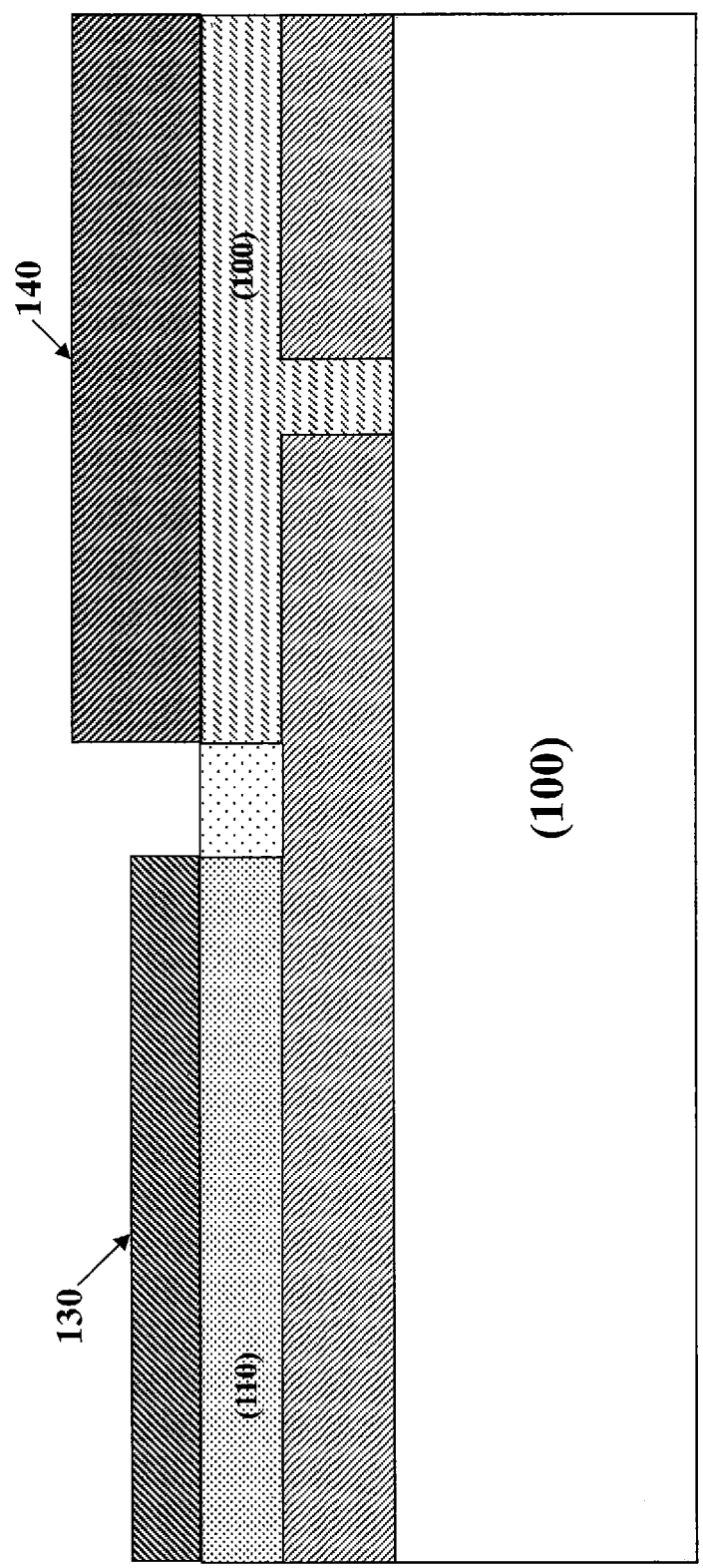
FIG. 2 is a cross-sectional view illustrating formation of first and second epitaxial regions during a single epitaxy step, in a method of manufacturing a multiple Vt device, according to an exemplary embodiment of the present invention.

Then, referring to FIG. 2, in accordance with an embodiment of the present invention, a single epitaxy step growing silicon-germanium (SiGe) is performed on the structure of FIG. 1 to result in a first epitaxial region 130 on the layer 107 and a second epitaxial region 140 on the layer 120. According to an embodiment of the present invention, the first and second epitaxial regions form first and second device layers. Due to the different crystallographic orientations of the layers 107 and 120, the first epitaxial region 130 has a different germanium concentration in the SiGe from the second epitaxial region 140, which results in different threshold voltages in a transistor(s) subsequently built onto those structures in the first and second epitaxial regions 130, 140. In accordance with an embodiment of the present invention, the resulting epitaxial regions 130, 140 comprise channel material upon which devices (e.g., transistors, such as pFETs and nFETs) are built, whereby the devices on respective epitaxial regions 130, 140 have different threshold voltages. Further, according to an embodiment, there is a thickness difference between the first and second epitaxial regions 130, 140. In accordance with an embodiment of the present invention, a gas mixture using silane or dichlorosilane (DCS) as a silicon source precursor and germane as a germanium precursor can be used to grow SiGe. In a non-limiting illustrative example, using a gas mixture comprising DCS in the single epitaxy step can result in SiGe having a (110) orientation, a thickness of 50 angstroms and a 25% Ge concentration on layer 107, and SiGe having a (100) orientation, a thickness of 75 angstroms and a 40% Ge concentration on layer 120, whereby the first epitaxial region 130 will result in devices having a higher Vt than devices on the second epitaxial region 140. In another non-limiting illustrative example, using a gas mixture comprising silane in the single epitaxy may have a different effect, whereby the Ge concentration and SiGe thickness is higher on the layer 107 so that the first epitaxial region 130 has a lower Vt than the second epitaxial region 140.

Figure 3:
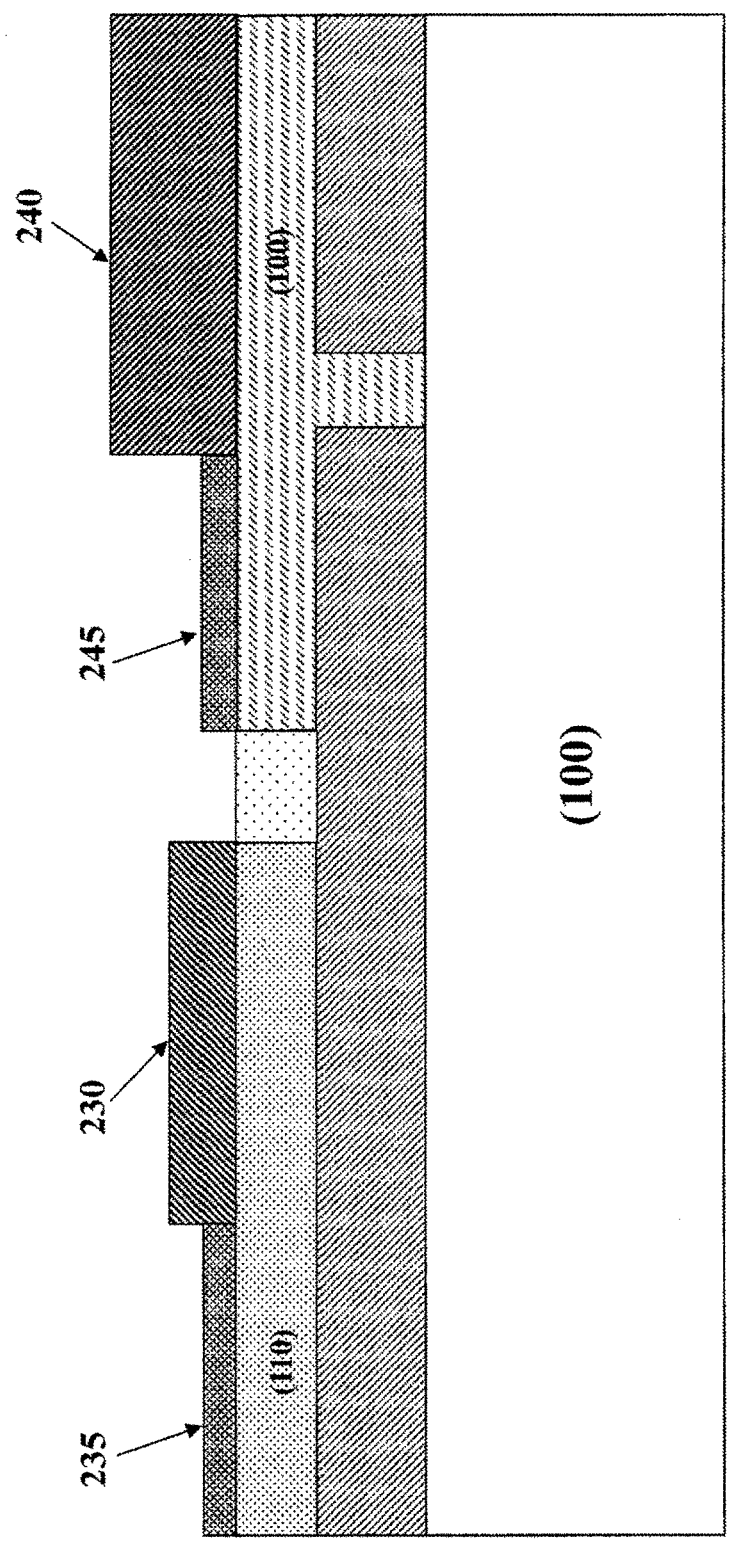
FIG. 3 is a cross-sectional view illustrating formation of first and second epitaxial regions during a single epitaxy step where portions of underlying layers are masked, in a method of manufacturing a multiple Vt device, according to an exemplary embodiment of the present invention.
Figure 4:
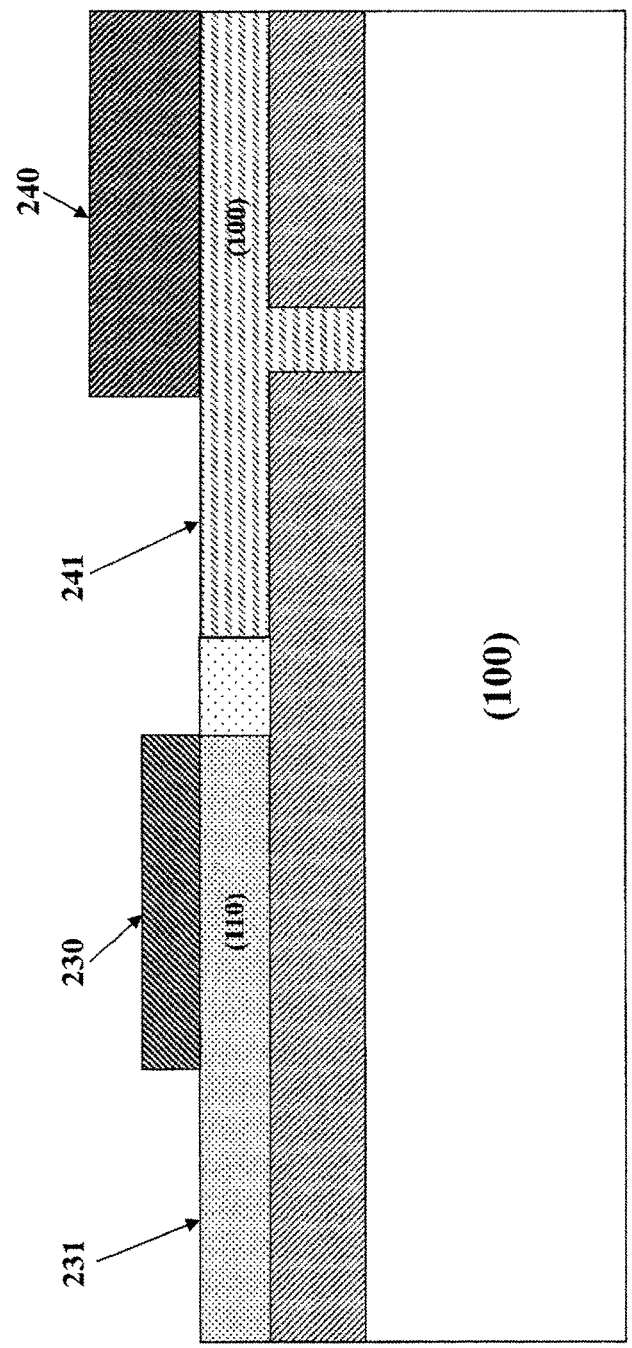
FIG. 4 is a cross-sectional view illustrating removal of the mask from the underlying layers of FIG. 3, in a method of manufacturing a multiple Vt device, according to an exemplary embodiment of the present invention.

Referring to FIG. 3, in another embodiment, the single epitaxy step can result in 3 or more threshold voltages when a mask covers part of layer 107 and/or part of layer 120 during the epitaxy process. For example, as can be seen in FIG. 3, masks 235, 245 cover parts of layers 107 and 120, respectively. The masks 235, 245 can comprise, for example, an oxide or nitride hard mask. The masks 235, 245 are applied to the structure in FIG. 1, and the single epitaxy step referenced above in connection with FIG. 2 is performed to result in a first epitaxial region 230 on the layer 107 and a second epitaxial region 240 on the layer 120. As explained in connection with FIG. 2, due to the different crystallographic orientations of the layers 107 and 120, the first epitaxial region 230 has a different material concentration from the second epitaxial region 240, which results in different voltage thresholds in devices built upon the first and second epitaxial regions 230, 240, and there is a thickness difference between the first and second epitaxial regions 230, 240. In a non-limiting illustrative embodiment, the first and second epitaxial regions 230, 240 can have the same composition as the first and second epitaxial regions 130, 140, each region 230 and 240 covering less of regions 107 and 120, respectively, than the regions 130, 140. The masks 235, 245 prevent epitaxial regions from forming on the covered portions of the layers 107 and 120. As can be seen in FIG. 4, the masks 235, 245 are removed, resulting in at least three different Vt regions from a single epitaxy step. For example, in the illustrative embodiment shown in FIG. 4, the regions 231 and 241 where no epitaxial growth occurred will result in devices having a higher Vt than devices on the first and second epitaxial regions 230 and 240, and the devices on the first epitaxial region 230 have a higher Vt than the Vt of those devices on the second epitaxial region 240.

Figure 5:
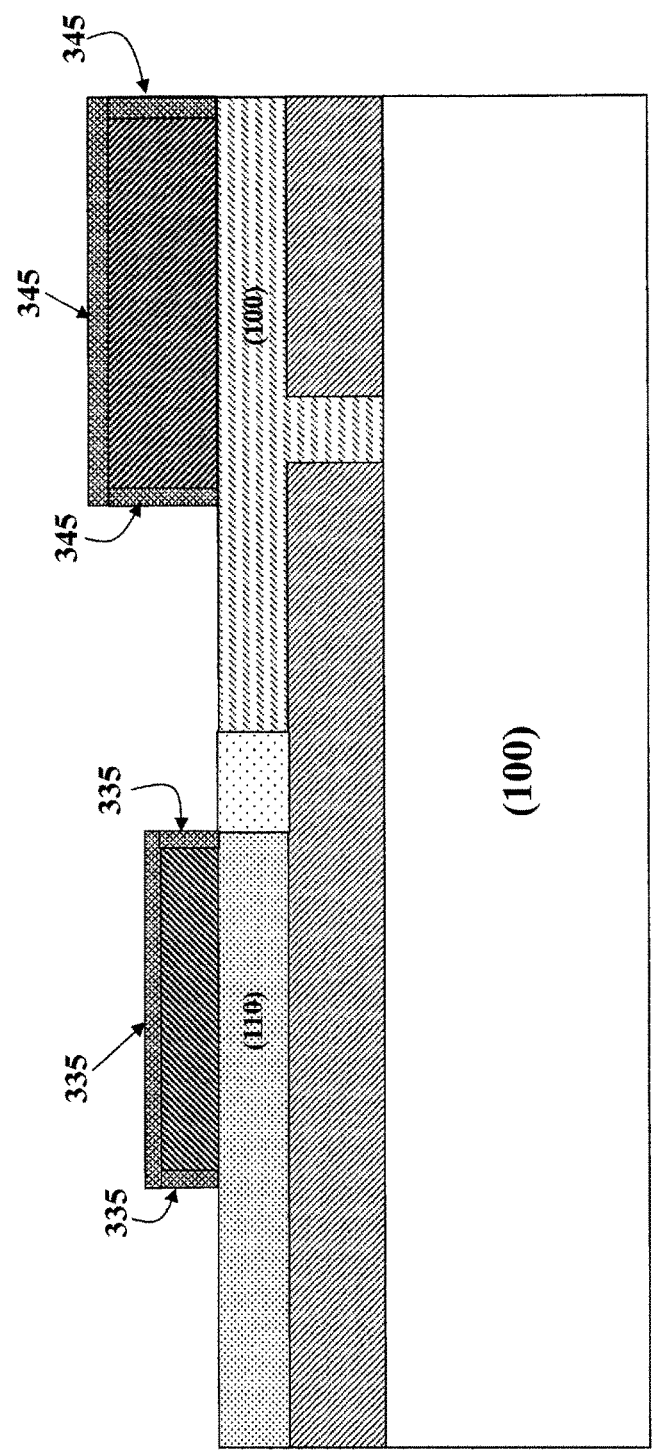
FIG. 5 is a cross-sectional view illustrating spacer formation and masking of first and second epitaxial regions, in a method of manufacturing a multiple Vt device, according to an exemplary embodiment of the present invention.
Figure 6:
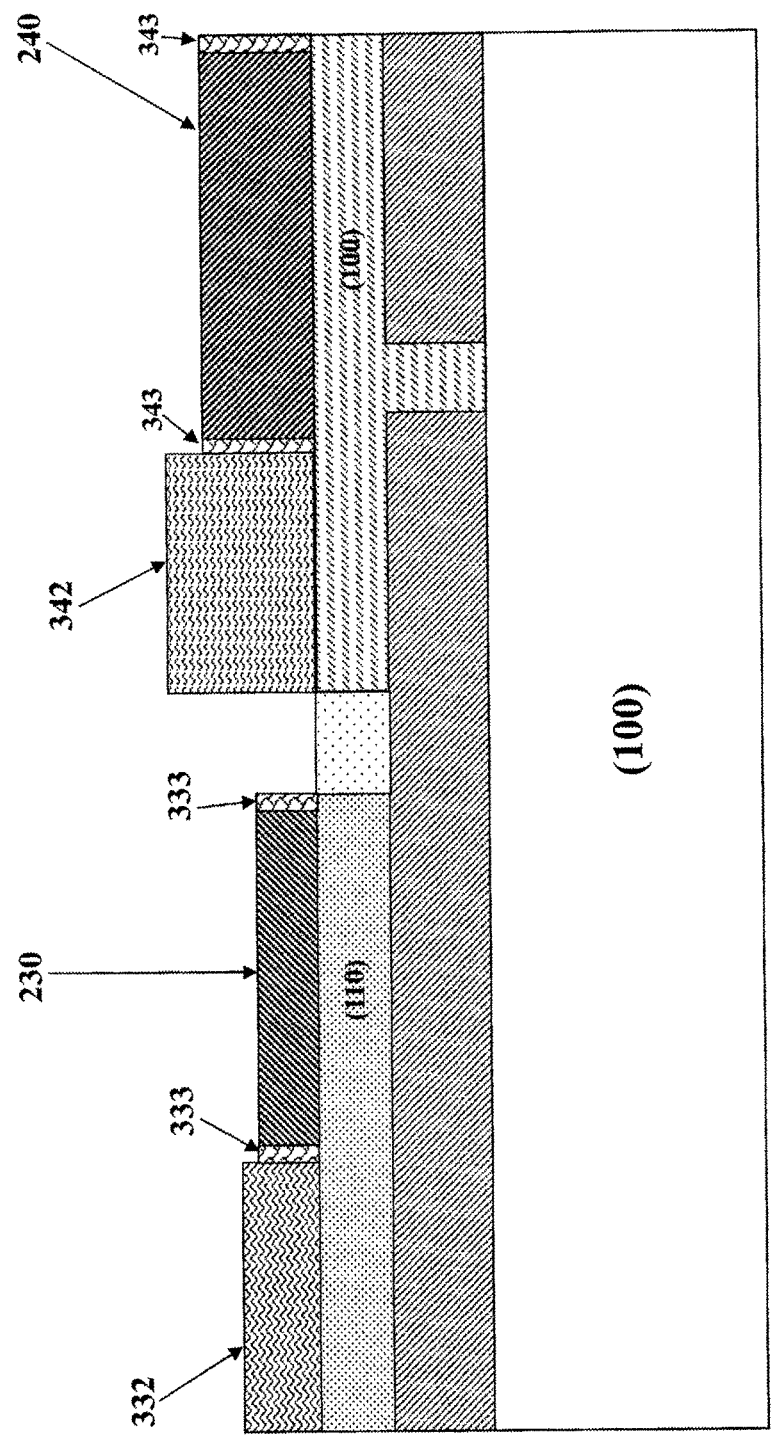
FIG. 6 is a cross-sectional view illustrating formation of third and fourth epitaxial regions during a second epitaxy step, in a method of manufacturing a multiple Vt device, according to an exemplary embodiment of the present invention.

Referring to FIG. 5, in another embodiment, a second epitaxy process can be performed to result in at least four different Vt devices. According to an embodiment, the regions 230 and 240 from FIG. 4 are masked with masks 335 and 345 that comprise, for example, an oxide or nitride hard mask. The second epitaxy process is performed on the structure including the masked regions 230 and 240. Referring to FIG. 6, the second epitaxy process is performed with a different silicon and germane precursor gas flow mixture than the first epitaxy process to achieve different Ge concentrations from regions 230 and 240 so that regions 332 and 342 have different compositions, resulting in regions 230, 240, 332 and 342 each having different compositions and different threshold voltage devices. For example, in a non-limiting illustrative embodiment, region 332 can comprise SiGe having a (110) orientation, a thickness of 60 angstroms and a 35% Ge concentration on layer 107, and region 342 can comprise SiGe having a (100) orientation, a thickness of 85 angstroms and a 35% Ge concentration on layer 120, whereby epitaxial region 332 results in a device having a higher Vt than a device on epitaxial region 342. According to an embodiment of the present invention, the epitaxial regions 230, 240, 332 and 342 form device layers. As explained above, the gas mixtures used during the epitaxy steps can comprise, for example, silane or DCS, and different variations of the silane and dichlorosilane (DCS). For example, other precursors such as digermane, trigermane, or disilane, trisilane or other higher order silanes or germanes can be used. Isolation regions 333 and 343 (e.g., STI regions) can be formed adjacent the regions 230 and 240 on both sides thereof. Isolation region 333 is between regions 230 and 332 and isolation region 343 is between regions 240 and 342.

Figure 7:
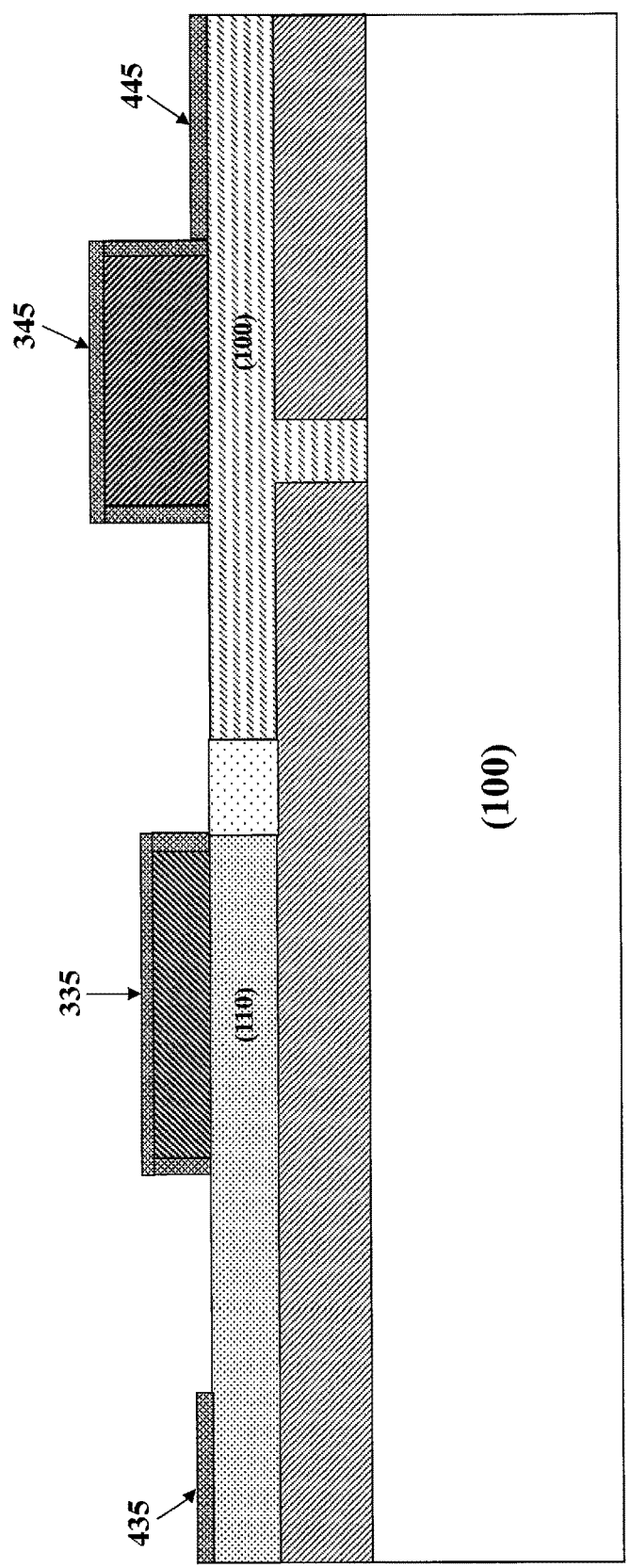
FIG. 7 is a cross-sectional view illustrating masking of portions of underlying layers and of first and second epitaxial regions prior to formation of third and fourth epitaxial regions, in a method of manufacturing a multiple Vt device, according to an exemplary embodiment of the present invention.
Figure 8:
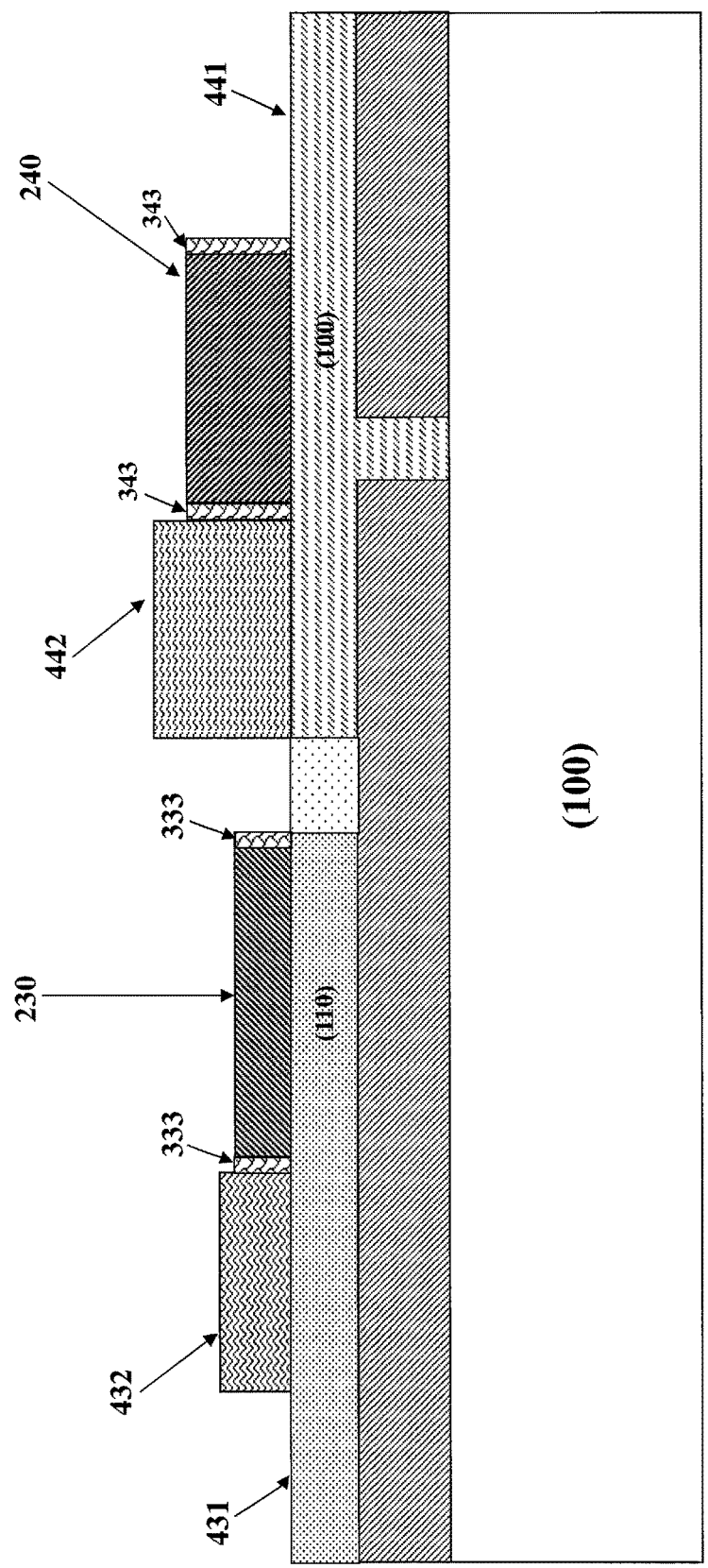
FIG. 8 is a cross-sectional view illustrating mask removal from the portions of the underlying layers after formation of third and fourth epitaxial regions, in a method of manufacturing a multiple Vt device, according to an exemplary embodiment of the present invention.

Referring to FIG. 7, in another embodiment, the two epitaxy steps can result in 5 or more threshold voltage devices when a mask covers part of layer 107 and/or part of layer 120 during the second epitaxy process. For example, as can be seen in FIG. 7, masks 435 and 445 cover parts of layers 107 and 120, respectively. The masks 435, 445 can comprise, for example, an oxide or nitride hard mask. The masks 435, 445 are applied to the structure in FIG. 5, and the second epitaxy step referenced above in connection with FIG. 5 is performed to result in epitaxial region 432 on the layer 107 and epitaxial region 442 on the layer 120 as shown in FIG. 8. As explained above, due to the different crystallographic orientations of the layers 107 and 120, the epitaxial region 432 has a different material concentration from the epitaxial region 442, which results in devices having different voltage thresholds in the epitaxial regions 432, 442, and there is a thickness difference between the epitaxial regions 432, 442. In a non-limiting illustrative embodiment, the epitaxial regions 432, 442 can have the same composition as the epitaxial regions 332, 342, each region 432 and 442 covering less of regions 107 and 120, respectively, than the regions 332, 342. The masks 435, 445 prevent epitaxial regions from forming on the covered portions of the layers 107 and 120. As can be seen in FIG. 8, the masks 435, 445 are removed, resulting in at least five different Vt device regions from two epitaxy steps. For example, in the illustrative embodiment shown in FIG. 8, the regions 431 and 441 where no epitaxial growth occurred result in devices having a higher Vt than those on the epitaxial regions 432 and 442, and the epitaxial region 432 results in a device having a higher Vt than the Vt of a device on the epitaxial region 442. In addition, epitaxial region 230 results in a device having a higher Vt than those on regions 240, 432 and 442, and a lower Vt device than on regions 431 and 441.

Figure 9:
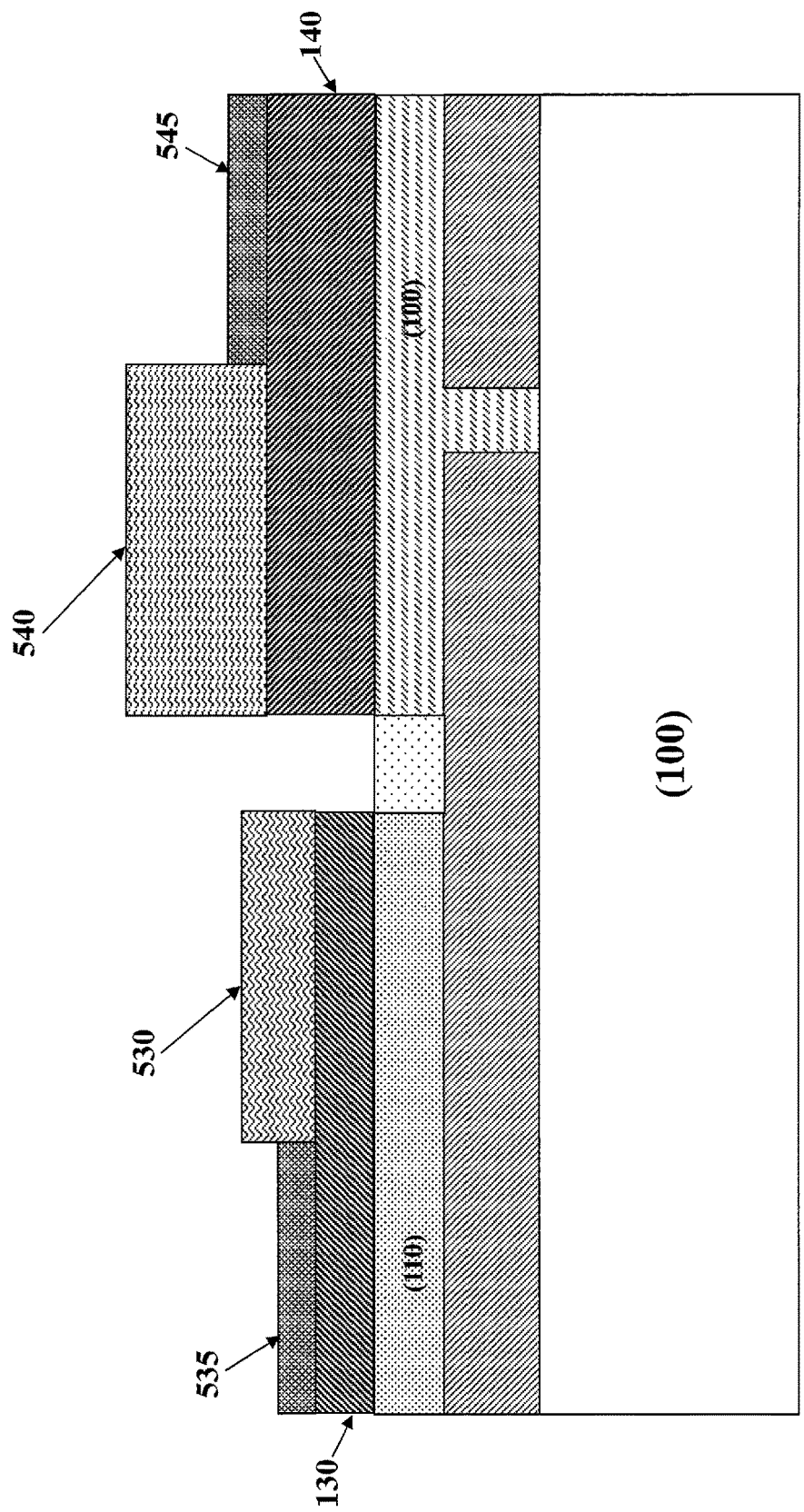
FIG. 9 is a cross-sectional view illustrating formation of third and fourth epitaxial regions on unmasked portions of first and second epitaxial regions during a second epitaxy step, in a method of manufacturing a multiple Vt device, according to an exemplary embodiment of the present invention.
Figure 10:
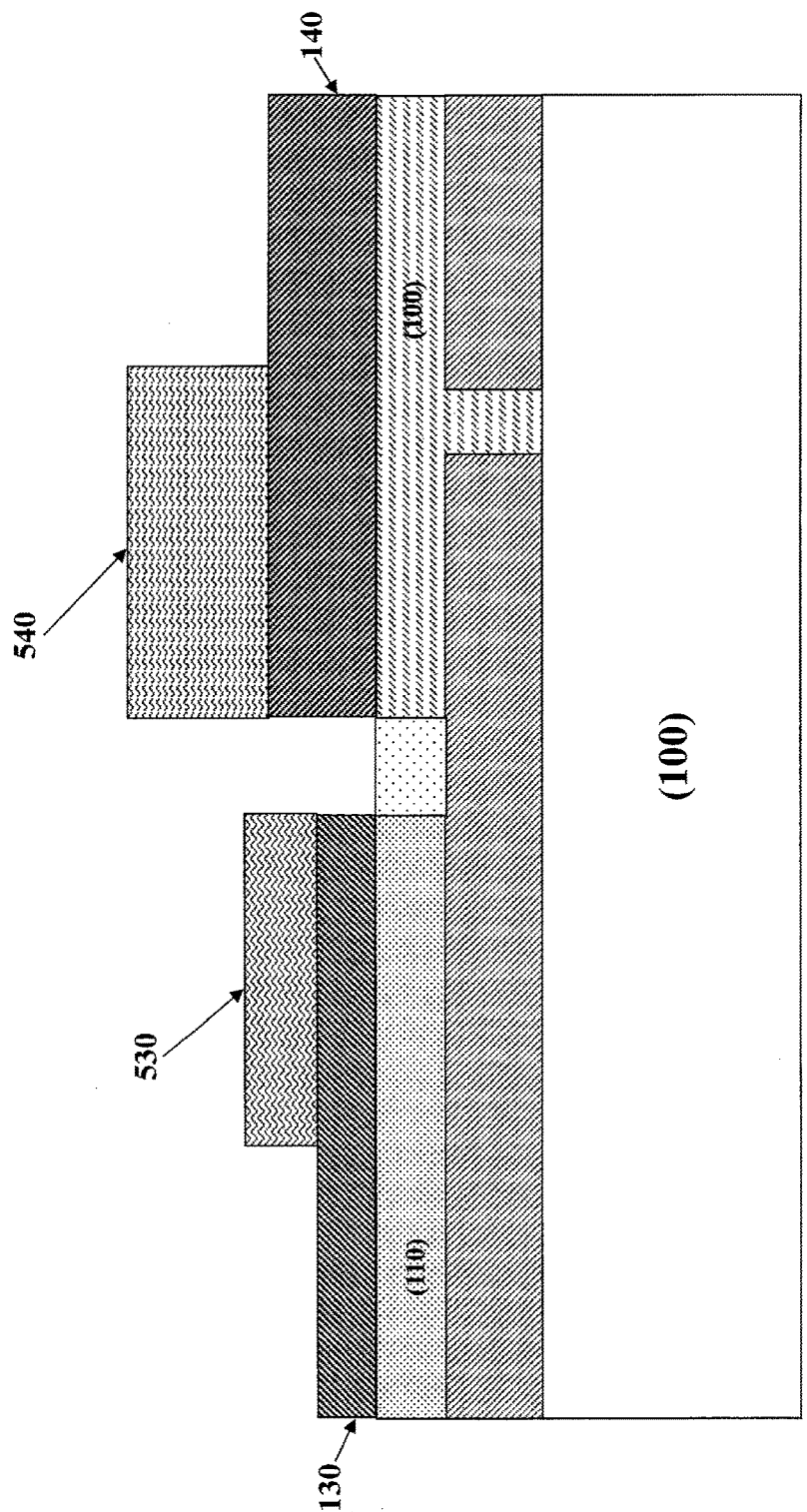
FIG. 10 is a cross-sectional view illustrating mask removal from the portions of the underlying first and second epitaxial regions after formation of third and fourth epitaxial regions, in a method of manufacturing a multiple Vt device, according to an exemplary embodiment of the present invention.

Referring to FIG. 9, in accordance with an embodiment of the present invention, two epitaxy steps can result in at least four threshold voltages and epitaxial regions in a stacked configuration when a mask covers part of region 130 and part of region 140 during the second epitaxy process. For example, as can be seen in FIG. 9, masks 535, 545 cover parts of layers 130 and 140, respectively, or different active regions (resulting later in different active regions with device having different Vt, depending on the underlying SiGe). The masks 535, 545 can comprise, for example, an oxide or nitride hard mask. The masks 535, 545 are applied to the structure in FIG. 2, and the second epitaxy step referenced above in connection with FIG. 6 is performed to result in an epitaxial region 530 on the region 130 and an epitaxial region 540 on the region 140. Due to the different crystallographic orientations of the layers 130 and 140, the epitaxial region 530 has a different material concentration from the epitaxial region 540, which results in different voltage threshold devices in the epitaxial regions 530, 540, and there is a thickness difference between the epitaxial regions 530, 540. In a non-limiting illustrative embodiment, the epitaxial regions 530, 540 can have the same composition as the epitaxial regions 332, 342, each region 530 and 540 being stacked on and covering part of regions 130 and 140, respectively. The masks 535, 545 prevent epitaxial regions from forming on the covered portions of the regions 130 and 140. As can be seen in FIG. 10, the masks 535, 545 are removed, resulting in at least four different Vt device regions 130, 140, 530 and 540 in a stacked configuration from two epitaxy steps. The second epitaxy process is performed with a different gas flow mixture than the first epitaxy process to achieve different Ge concentrations from regions 130 and 140 so that regions 530 and 540 have different compositions, resulting in regions 130, 140, 530 and 540 each having different compositions and different threshold voltage devices.

Figure 11:
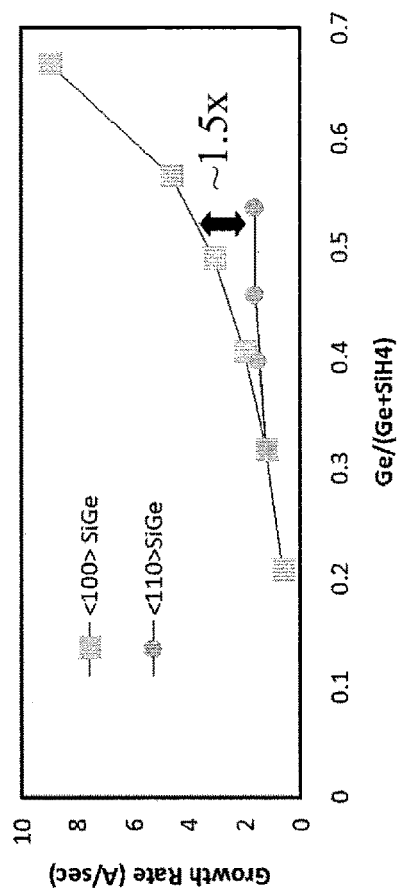
FIG. 11 is a graph of SiGe growth rates, according to an exemplary embodiment of the present invention.
Figure 12:
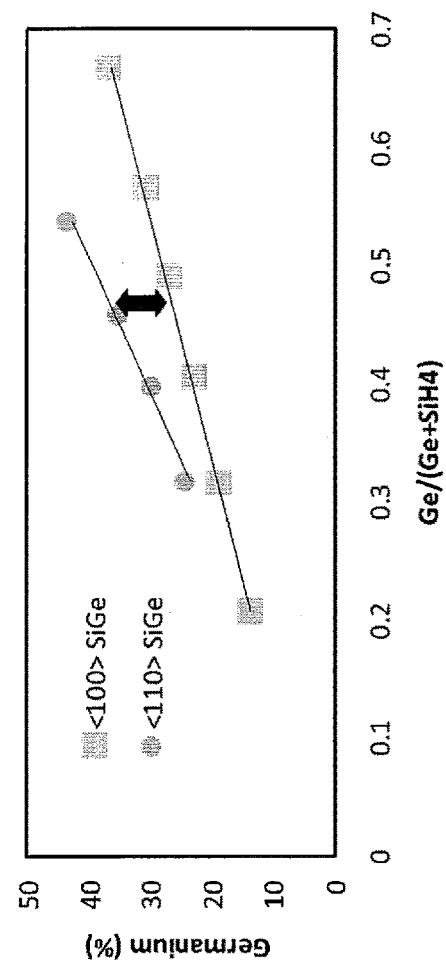
FIG. 12 is a graph of SiGe compositions, according to an exemplary embodiment of the present invention.

FIGS. 11 and 12 are graphs of SiGe growth rates and compositions in connection with the embodiment in FIG. 2.

FIG. 11 is a graph of SiGe growth rate for regions 130 and 140 in FIG. 2, where region 130 is (110) SiGe and region 140 is (100) SiGe. FIG. 11 plots experimental data of growth rate in angstroms/sec of the resulting epitaxial region versus partial pressure of germane in the $GeH_4+SiH_4$ gas mixture used for epitaxial growth. As can be seen in FIG. 11, the growth rate for region 140 ((100) SiGe) is faster as the partial pressure increases (e.g., from 0.4 to 0.7). Accordingly, the growth rate can be controlled on different orientations of silicon by controlling the partial pressure.

FIG. 12 is a graph of SiGe composition for regions 130 and 140 in FIG. 2, where region 130 is (110) SiGe and region 140 is (100) SiGe. FIG. 12 plots experimental data of germanium percentage in the resulting epitaxial region versus partial pressure of germane in the GeH4+SiH4 gas mixture used for epitaxial growth. As can be seen in FIG. 12, the germanium concentration (Ge %) for region 130 ((110) SiGe) is higher as the partial pressure increases. Accordingly, the SiGe composition can be controlled on different orientations of silicon by controlling the partial pressure.

Figure 13A:
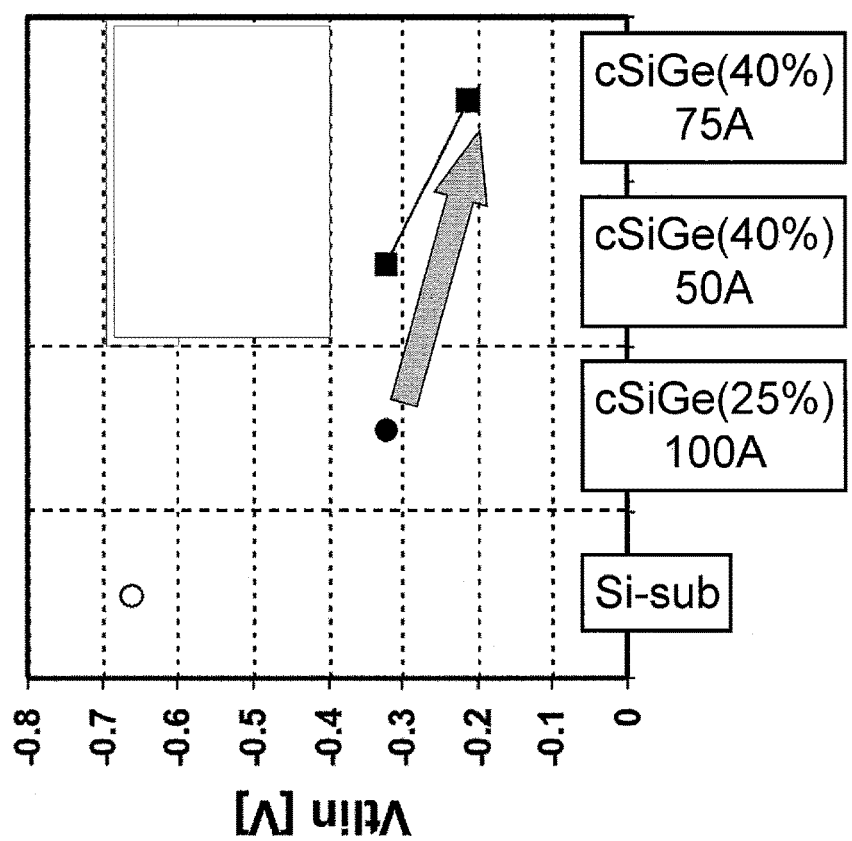
FIGS. 13A and 13B are graphs showing Vt modulation with SiGe, according to an exemplary embodiment of the present invention.
Figure 13B:
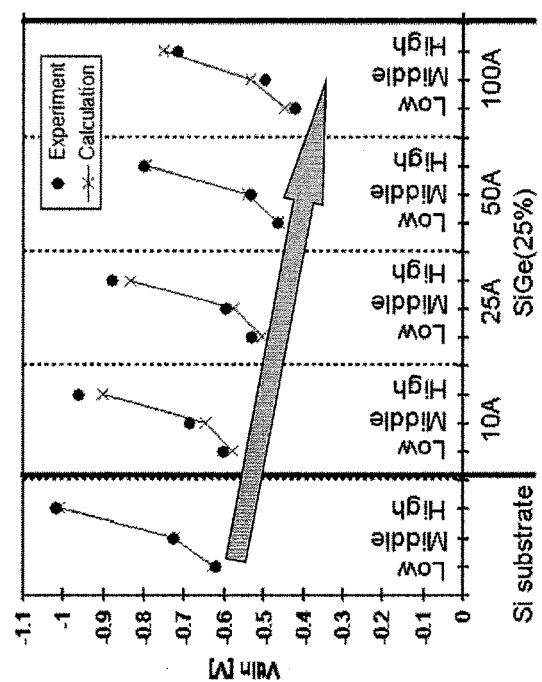

FIGS. 13A and 13B are graphs showing the threshold voltage (Vt) modulation with SiGe. The graphs show experimental and calculated data for threshold voltage shift depending on SiGe composition and thickness of a resulting epitaxial layer. For example, FIG. 13A shows a decreasing threshold voltage (Y-axis) from a Si substrate to 100 Å 25% SiGe and from 50 Å 40% SiGe to 75 Å 40% SiGe (X-axis). The threshold voltage between 100 Å 25% SiGe and 50 Å 40% SiGe is about the same, and there is about a 120 mV shift in Vt between 100 Å 25% SiGe and 75 Å 40% SiGe.

FIG. 13B illustrates threshold voltage shifts based on thickness of 25% SiGe. As can be seen, both calculated and experimental data show that threshold voltage (Y-axis) decreases about 10 mV per additional angstrom for 25% SiGe (X-axis includes 10, 25, 50 and 100 Å 25% SiGe. The indicators Low, Middle and High represent relative well-doping in the devices, illustrating that Vt modulation is effective for multiple well-dopings.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
a hybrid orientation substrate including a first silicon region having a first crystallographic orientation and a second silicon region having a second crystallographic orientation different from the first crystallographic orientation;
wherein the first silicon region and the second silicon region are formed on a top surface of a buried insulating layer formed on a semiconductor substrate, and a portion of the second silicon region is in contact with the semiconductor substrate through a contact hole in the buried insulating layer;
a first layer disposed on the first silicon region and having the first crystallographic orientation and a first composition;
a second layer disposed on the second silicon region and having the second crystallographic orientation and a second composition different from the first composition;
wherein the first and second compositions each comprises silicon germanium (SiGe);
a lower isolation region formed between the first and second silicon regions, wherein the lower isolation region is coplanar with the first and second silicon regions;
a plurality of upper isolation regions disposed on the first silicon region and on opposite lateral sides of the first layer;
wherein the first layer is disposed on part of a top surface of the first silicon region without covering all of the top surface of the first silicon region, and the second layer is disposed on part of a top surface of the second silicon region without covering all of the top surface of the second silicon region; and
a third layer disposed on the top surface of the first silicon region adjacent the first layer in a lateral direction, wherein the third layer has the first crystallographic orientation and a third composition different from the first and second compositions.

2. The semiconductor device according to claim 1, wherein the first and second layers have different thicknesses from each other.

3. The semiconductor device according to claim 1, wherein the first and second compositions each comprises different percentages of germanium from each other.

4. The semiconductor device according to claim 1, further comprising a fourth layer disposed on the top surface of the second silicon region adjacent the second layer in a lateral direction, wherein the fourth layer has the second crystallographic orientation.

5. The semiconductor device according to claim 4, further comprising a first upper isolation region of the plurality of upper isolation regions formed between the first and third layers and a second upper isolation region formed between the second and fourth layers.

6. The semiconductor device according to claim 4, wherein the first layer and the third layer are disposed on part of the first silicon region without covering all of the top surface of the first silicon region, and the second layer and the fourth layer are disposed on part of the second silicon region without covering all of the top surface of the second silicon region.

7. The semiconductor device according to claim 4, wherein the third and fourth layers have different thicknesses from each other.

8. A semiconductor device, comprising:
a hybrid orientation substrate including a first silicon region having a first crystallographic orientation and a second silicon region having a second crystallographic orientation different from the first crystallographic orientation;
wherein the first silicon region and the second silicon region are formed on a top surface of a buried insulating layer formed on a semiconductor substrate, and a portion of the second silicon region is in contact with the semiconductor substrate through a contact hole in the buried insulating layer;
a first layer disposed on the first silicon region and having the first crystallographic orientation and a first composition;
a second layer disposed on the second silicon region and having the second crystallographic orientation and a second composition different from the first composition;
wherein the first and second compositions each comprises silicon germanium (SiGe);
a lower isolation region formed between the first and second silicon regions, wherein the lower isolation region is coplanar with the first and second silicon regions;
a third layer disposed on a top surface of the first silicon region adjacent the first layer in a lateral direction, wherein the third layer has the first crystallographic orientation and a third composition different from the first and second compositions;
a fourth layer disposed on a top surface of the second silicon region adjacent the second layer in a lateral direction, wherein the fourth layer has the second crystallographic orientation; and a first upper isolation region formed between the first and third layers and a second upper isolation region formed between the second and fourth layers;

wherein the first layer is disposed on part of the top surface of the first silicon region without covering all of the top surface of the first silicon region, and the second layer is disposed on part of the top surface of the second silicon region without covering all of the top surface of the second silicon region;

wherein the first upper isolation region is coplanar with the first layer and not coplanar with the third layer; and wherein the second upper isolation region is coplanar with the second layer and not coplanar with the fourth layer.

9. The semiconductor device according to claim 8, wherein the first and second layers have different thicknesses from each other.

10. The semiconductor device according to claim 8, wherein the first and second compositions each comprises different percentages of germanium from each other.

11. The semiconductor device according to claim 8, wherein the third layer is disposed on part of the top surface of the first silicon region without covering all of the top surface of the first silicon region, and the fourth layer is disposed on part of the top surface of the second silicon region without covering all of the top surface of the second silicon region.

12. The semiconductor device according to claim 8, wherein the third and fourth layers have different thicknesses from each other.

* * * * *